(12) United States Patent
Gu et al.

(10) Patent No.: US 9,150,963 B2
(45) Date of Patent: Oct. 6, 2015

(54) METHOD FOR DEPOSITING PHOSPHOSILICATE GLASS

(71) Applicant: SHANGHAI HUALI MICROELECTRONICS CORPORATION, Shanghai (CN)

(72) Inventors: Meimei Gu, Shanghai (CN); Duoyuan Hou, Shanghai (CN); Huijun Zhang, Shanghai (CN); ChienWei Chen, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 300 days.

(21) Appl. No.: 13/728,743

(22) Filed: Dec. 27, 2012

(65) Prior Publication Data
US 2013/0183458 A1    Jul. 18, 2013

(30) Foreign Application Priority Data

Jan. 12, 2012  (CN) .......................... 2012 1 0009089

(51) Int. Cl.
| | | |
|---|---|---|
| C23C 14/10 | (2006.01) | |
| C23C 14/34 | (2006.01) | |
| C23C 16/40 | (2006.01) | |
| C23C 16/04 | (2006.01) | |

(52) U.S. Cl.
CPC .............. *C23C 16/401* (2013.01); *C23C 16/045* (2013.01)

(58) Field of Classification Search
CPC ............................ C23C 14/0036; C23C 14/10
USPC .......................................... 204/192.1, 192.12
See application file for complete search history.

(56) References Cited

U.S. PATENT DOCUMENTS

| | | | | |
|---|---|---|---|---|
| 3,743,587 | A * | 7/1973 | Kennedy ................... | 204/192.15 |
| 5,930,677 | A * | 7/1999 | Zheng et al. ................... | 438/782 |
| 6,061,323 | A * | 5/2000 | Jerman et al. ............... | 369/13.32 |
| 6,078,707 | A * | 6/2000 | Yamamoto et al. .............. | 385/14 |
| 7,205,240 | B2 * | 4/2007 | Karim et al. ................... | 438/694 |
| 2006/0003582 | A1 * | 1/2006 | Roh ............... | 438/675 |
| 2006/0148205 | A1 * | 7/2006 | Akiba et al. .................. | 438/424 |
| 2008/0096364 | A1 * | 4/2008 | Wilson et al. ................. | 438/424 |
| 2009/0102008 | A1 * | 4/2009 | Kakehata ....................... | 257/506 |

(Continued)

OTHER PUBLICATIONS

Chandra, Sudhir, et al., "A new technique for preparing PSG film using RF magnetron sputtering". Proc. of SPIE vol. 6415, 6415H (2006), pp. 1-9. Micro- and Nanotechnology: Materials, Processes, Packaging, and Systems III, edited by Jung-Chih Chiao et al.*

(Continued)

*Primary Examiner* — Bret Chen
(74) *Attorney, Agent, or Firm* — Muncy, Geissler, Olds & Lowe, P.C.

(57) ABSTRACT

A method of depositing phosphosilicate glass (PSG) is disclosed. The method includes a first deposition step for depositing a first PSG layer with a sputtering deposition ratio of 0.10 to 0.16, and a second deposition step for depositing a second PSG layer with a sputtering deposition ratio of 0.18 to 0.22 after the first deposition step. The first PSG layer has a thickness smaller than that of the second PSG layer. With such two-step deposition method, flower pattern having a dramatically reduced size can be formed without occurrence of clipping or formation of sidewall voids in the resultant gate patterns. Specifically, the formed flower pattern has a height reduced by about 50% and a thickness reduced by about 30%.

8 Claims, 3 Drawing Sheets

First deposition step: depositing a first PSG layer having a phosphorus concentration of 4.0% with a sputtering deposition ratio of 0.10 to 0.16

Second deposition step: depositing a second PSG layer having a phosphorus concentration of 4.0% with a sputtering deposition ratio of 0.18 to 0.22

(56) References Cited

U.S. PATENT DOCUMENTS

| | | | |
|---|---|---|---|
| 2009/0286381 A1* | 11/2009 | van Schravendijk et al. | 438/435 |
| 2010/0052073 A1* | 3/2010 | Taya | 257/392 |
| 2012/0282756 A1* | 11/2012 | Meng | 438/435 |

OTHER PUBLICATIONS

Hsiao, Wen-Chu, et al., "Influence of thermal budget on phosphosilicate glass prepared by high-density plasma chemical-vapor deposition". J. Vac. Sci. Technol. B 23(5), Sep./Oct. 2005, pp. 2146-2150.*

Bhatt, Vivekanand, et al., "Microstructures using RF sputtered PSG film as a sacrificial layer in surface micromachining." Sadhana, Vo.34, Part 4, Aug. 2009, pp. 557-562.*

Bhatt, Vivekanand, et al., "Silicon Nitride Films Deposited by RF Sputtering for Microstructure Fabrication in MEMS". Journal of Electronic Materials, vol. 38, No. 9, 2009, pp. 1979-1989.*

* cited by examiner

First deposition step: depositing a first PSG layer having a phosphorus concentration of 4.0% with a sputtering deposition ratio of 0.10 to 0.16

↓

Second deposition step: depositing a second PSG layer having a phosphorus concentration of 4.0% with a sputtering deposition ratio of 0.18 to 0.22

METHOD FOR DEPOSITING PHOSPHOSILICATE GLASS

CROSS-REFERENCES TO RELATED APPLICATIONS

This application claims the priority of Chinese patent application number 201210009089.9, filed on Jan. 12, 2012, the entire contents of which are incorporated herein by reference.

TECHNICAL FIELD

The present invention relates to semiconductor fabrication, and more particularly, to a method of depositing phosphosilicate glass (PSG).

BACKGROUND

Currently, the process of growing phosphosilicate glass (PSG) by high-density plasma chemical vapor deposition (HDP CVD) (collectively referred to as HDP PSG) has been widely adopted in contact hole layer formation at 130 nm technology node and below. In order to meet requirements on gap-fill, it is a common practice to use helium (He) rather than argon (Ar) as a sputtering gas in HDP CVD processes at 130 nm technology node and below.

However, due to certain characteristics of an He-based HDP PSG process, it is prone to form a profile of a flower-shaped crust, referred to as a "flower pattern", hung over each of the pattern areas, as shown in FIG. 2. Although some devices are fabricated by employing self-aligned processes for forming contact holes using PSG with a high phosphorus concentration (9%) to meet practical needs, different devices may have different requirements for the PSG processes. In most of the logic processes, the contact hole layer is generally formed by adopting a phosphorus concentration of 4% and it is required to have a minimized size of the flower patterns so as to ensure the stability of a resulting device and the repeatability of an etching

SUMMARY OF THE INVENTION

The present invention addresses the aforementioned issues encountered in the prior art by presenting a novel multi-step deposition method to form phosphosilicate glass (PSG) by high-density plasma chemical vapor deposition (HDP CVD) with modified sputtering deposition ratios. This method is able to control the shape and size of the flower patterns concurrently formed with the formation of PSG, and hence able to improve the phosphorus concentration uniformity and the etching uniformity of the contact layer of the device.

A first aspect of the present invention provides a method of depositing phosphosilicate glass, which includes: a first deposition step for depositing a first PSG layer with a sputtering deposition ratio of 0.10 to 0.16; and a second deposition step for depositing a second PSG layer with a sputtering deposition ratio of 0.18 to 0.22 after the first deposition step, wherein the first PSG layer has a thickness smaller than that of the second PSG layer.

Preferably, the method is used at 130 nm technology node and below.

Preferably, the sputtering deposition ratio of the first deposition step is 0.13.

Preferably, the sputtering deposition ratio of the second deposition step is 0.20.

Preferably, both the PSG layers deposited in the first and second deposition steps have a phosphorus concentration of 4.0%.

Preferably, a thickness of the first PSG layer is 5% to 30% of a thickness of a resultant layer, while a thickness of the second PSG layer is 70% to 95% of the thickness of the resultant layer.

Preferably, a thickness of the first PSG layer is 10% of a thickness of a resultant layer, while a thickness of the second PSG layer is 90% of the thickness of the resultant layer of the present invention.

Preferably, both the first deposition step and the second deposition step employ a high-density plasma chemical vapor deposition process.

With the two-step deposition method according to the present invention, the size of the flower patterns formed can be dramatically reduced while ensuring no occurrence of clipping and no formation of sidewall voids in the gate patterns. Specifically, the height of the crusts can be reduced by about 50% and the crust thickness can be reduced by about 30%.

BRIEF DESCRIPTION OF THE DRAWINGS

The present invention with its accompanying advantages and features will be more readily understood from the following detailed description taken in conjunction with the accompanying drawings, in which.

Figures 1, 2:
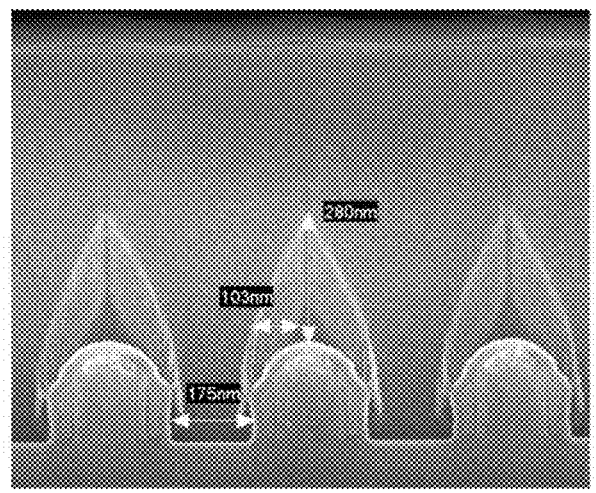
FIG. 1 is a flow chart illustrating a two-step method of depositing phosphosilicate glass (PSG) according to an embodiment of the present invention.
FIG. 2 depicts the profile of flower patterns of PSG with a phosphorus concentration of 4.0% deposited by HDP CVD with a sputtering deposition ratio of 0.129.

The accompanying drawings may not be to scale, and are incorporated to depict the invention only. Therefore, the drawings should not be construed in any manner that they would be limiting to the scope of the invention. In the drawings, the same or similar reference numbers represent the same or similar elements.

DETAILED DESCRIPTION

Upon reading the following description of specific embodiments in conjunction with the accompanying drawing figures, the concepts of the present invention will be clearer and easier to be understood.

As shown in FIG. 2, flower patterns with a height of 280 nm and a crust thickness of 103 nm are formed in an upper portion of the phosphosilicate glass (PSG) deposited by a traditional high-density plasma chemical vapor deposition (HDP CVD) gap-fill process with a sputtering deposition ratio of 0.129.

Where, the sputtering deposition ratio is defined as the ratio of a sputtering rate to a deposition rate.

Figure 3:
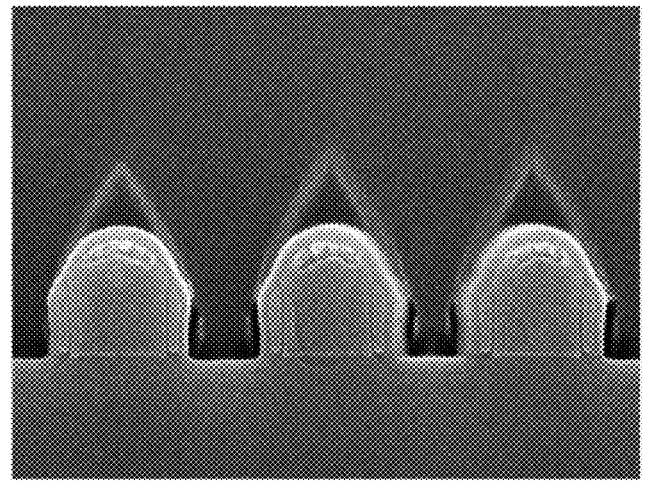
FIG. 3 depicts the profile of flower patterns of PSG with a phosphorus concentration of 4.0% deposited by HDP CVD with a sputtering deposition ratio of 0.25.

With reference to FIG. 3, when the sputtering deposition ratio of the HDP CVD process is increased to 0.25 by increasing the sputtering rate, the size of the flower patterns formed will be significantly reduced. However, concurrent with the size reduction of the flower patterns, in the resultant gate patterns, clipping will occur and sidewall voids will be formed, which is intolerable for process integration.

Figure 4:
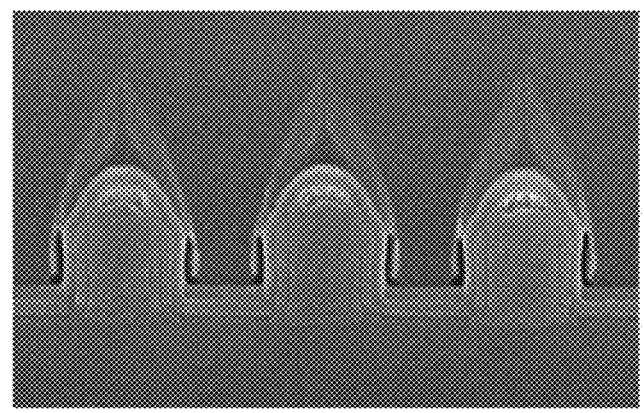
FIG. 4 depicts the profile of flower patterns of PSG with a phosphorus concentration of 4.0% deposited by HDP CVD with a sputtering deposition ratio of 0.20.

Moreover, as shown in FIG. 4, although the occurrence of clipping can be prevented by lowering the sputtering deposition ratio somehow to 0.2 based on the process conditions corresponding to FIG. 2, the sidewall voids will still be formed, and what is even worse is that the size of the flower patterns formed will increase rapidly.

A similar result will be reached by increasing the sputtering deposition ratio a bit based on the process conditions corresponding to FIG. 2, i.e., clipping will not occur, but sidewall voids will still be formed and the size of formed flower patterns will increase rapidly, as shown in FIG. 4.

Due to the aforementioned limitation of a single-step deposition method to solve the flower pattern issue, this invention proposes a two-step deposition method.

FIG. 1 is a flow chart illustrating a two-step method of depositing phosphosilicate glass (PSG) according to an embodiment of the present invention.

Referring to FIG. 1, the two-step PSG deposition method of this embodiment includes two steps as follows.

In a first deposition step S1, a PSG layer (with a phosphorus concentration of, for example, 4.0%) is deposited with a sputtering deposition ratio of 0.10 to 0.16. Preferably, the thickness of the PSG layer deposited in this step takes up 10% of the thickness of a resultant layer. With such a low sputtering deposition ratio, this step can address the issue of sidewall voids formation and can lower the gap-fill difficulty for the subsequent second deposition step. In addition, in order to minimize the formation of sidewall voids, an optimal sputtering deposition ratio of 0.13 is preferably adopted in this step.

In a second deposition step S2, another PSG layer (with a phosphorus concentration of, for example, 4.0%) is deposited with a sputtering deposition ratio of 0.18 to 0.22. Preferably, the thickness of the PSG layer deposited in this step takes up 90% of the thickness of the resultant layer. By depositing PSG to a targeted thickness with a high sputtering deposition ratio, this step can result in flower patterns with a minimized size while ensuring no occurrence of clipping. In addition, in order to minimize the formation of voids, an optimal sputtering deposition ratio of 0.20 is preferably adopted in this step.

Further, in this method, the PSG layer deposited in the first deposition step S1 has a thickness smaller than that of the PSG layer deposited in the second deposition step S2. Percentage of the thickness of the PSG layer deposited in the first deposition step S1 to that of the resultant layer may be adjusted within an appropriate range, such as 5% to 30%, which means the percentage of the thickness of the PSG layer deposited in the second deposition step S2 to that of the resultant layer may be adjusted within a corresponding appropriate range, such as 70% to 95%. Moreover, according to the foregoing description, to achieve the best effect, the most preferable values for the former two percentages are 10% and 90%, respectively.

Furthermore, the phosphorus concentration in the first and second deposition steps S1 and S2 is not limited to 4.0%. It may be adjusted within a range, such as 3.5% to 4.5%, and is more preferred to be adjusted within the range of 3.8% to 4.2%. Moreover, according to the foregoing description, in order to achieve the best effect, the phosphorus concentration in the two steps is most preferred to be 4.0%. It should be appreciated that even numbers of values have been given above, the phosphorus concentration is not limited to any of them and can be adjusted to any intended values.

Figure 5:
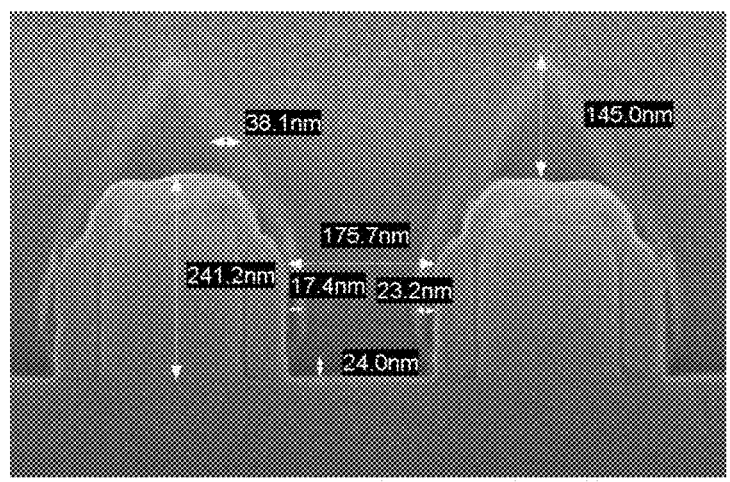
FIG. 5 depicts the profile of flower patterns of PSG with a phosphorus concentration of 4.0% deposited by a two-step method of depositing PSG according to an embodiment of the present invention.

FIG. 5 depicts the profile of flower patterns of phosphosilicate glass (PSG) with a phosphorus concentration of 4.0% deposited by the two-step high-density plasma chemical vapor deposition (HDP CVD) according to the above embodiment of the present invention. As shown in the figure, each of the flower patterns has a height of 145 nm and a crust thickness of 38 nm.

Compared to the flower patterns in FIG. 2, it is obvious that the method of the present invention can result in flower patterns with significantly reduced size: about 50% reduction in height and about 30% reduction in crust thickness.

The method of the present invention is particularly suitable to be used at 130 nm technology node and below.

While this invention has been particularly shown and described with respect to foregoing preferred embodiments, it will be understood that they are not intended to limit the scope of the present invention in any way. Accordingly, those skilled in the art will appreciate that various alternative and equivalent embodiments can be made based on the disclosure. In addition, those skilled in the art can make various modifications and variations of the present invention without departing from the scope and spirit of the invention. Thus, it is intended that the present invention covers all such simple changes, equivalent variations and modifications provided they come within the scope of the present invention.

What is claimed is:

1. A method of depositing phosphosilicate glass (PSG), the method comprising:
   a first deposition step for depositing a first PSG layer with a sputtering deposition ratio of 0.10 to 0.16; and
   a second deposition step for depositing a second PSG layer with a sputtering deposition ratio of 0.18 to 0.22 after the first deposition step,
   wherein the first PSG layer has a thickness smaller than a thickness of the second PSG layer, and the sputtering deposition ratio is defined as a ratio of a sputtering rate to a deposition rate during the first or second deposition step.

2. The method according to claim 1, wherein the method is used at 130 nm technology node and below.

3. The method according to claim 1, wherein the first deposition step has a sputtering deposition ratio of 0.13.

4. The method according to claim 1, wherein the second deposition step has a sputtering deposition ratio of 0.20.

5. The method according to claim 1, wherein both the first PSG layer and the second PSG layer have a phosphorus concentration of 4.0%.

6. The method according to claim 1, wherein the thickness of the first PSG layer is 5% to 30% of a thickness of a resultant layer, while the thickness of the second PSG layer is 70% to 95% of the thickness of the resultant layer.

7. The method according to claim 1, wherein the thickness of the first PSG layer is 10% of a thickness of a resultant layer, while the thickness of the second PSG layer is 90% of the thickness of the resultant layer.

8. The method according to claim 1, wherein both the first deposition step and the second deposition step employ a high-density plasma chemical vapor deposition process.

* * * * *